(12) United States Patent
Fazeel et al.

(10) Patent No.: US 11,568,923 B1
(45) Date of Patent: Jan. 31, 2023

(54) CMOS ACTIVE INDUCTOR CIRCUIT FOR AMPLIFIER

(71) Applicant: CADENCE DESIGN SYSTEMS, INC., San Jose, CA (US)

(72) Inventors: Hajee Mohammed Shuaeb Fazeel, Bengaluru (IN); Vinod Kumar, Uttar Pradesh (IN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 44 days.

(21) Appl. No.: 17/352,938

(22) Filed: Jun. 21, 2021

(51) Int. Cl.
  *G11C 11/24* (2006.01)
  *G11C 11/4093* (2006.01)
  *H03F 3/45* (2006.01)

(52) U.S. Cl.
  CPC ...... *G11C 11/4093* (2013.01); *H03F 3/45269* (2013.01); *H03F 2200/372* (2013.01)

(58) Field of Classification Search
  CPC ............ G11C 11/4093; H03F 3/45269; H03F 2200/372
  USPC ........................................................ 365/149
  See application file for complete search history.

(56) References Cited

U.S. PATENT DOCUMENTS

| | | | | |
|---|---|---|---|---|
| 7,042,317 B2 * | 5/2006 | Xiao | ..................... | H03H 11/486 333/214 |
| 7,202,706 B1 * | 4/2007 | Plasterer | .......... | H03K 19/01728 326/86 |
| 7,532,065 B2 * | 5/2009 | Chen | ................... | H03F 3/45973 330/9 |
| 7,639,079 B2 * | 12/2009 | Chang | ................. | H03F 3/45188 330/292 |
| 7,880,568 B2 * | 2/2011 | Amin | ..................... | H03H 11/48 333/214 |
| 8,200,179 B1 * | 6/2012 | Mosinskis | ......... | H04L 25/03254 455/240.1 |
| 9,252,744 B2 * | 2/2016 | Leuzzi | .................... | H03H 11/48 |
| 9,312,819 B1 * | 4/2016 | Chen | ..................... | H03H 11/48 |
| 10,637,695 B1 * | 4/2020 | Venkatesan | ......... | H04L 25/0278 |
| 10,673,606 B1 * | 6/2020 | Lin | ........................ | H04L 5/1461 |
| 10,903,798 B2 * | 1/2021 | Bozorg | ..................... | H03F 3/19 |
| 11,159,152 B1 * | 10/2021 | Ayya | ...................... | H03K 3/017 |
| 11,381,427 B1 * | 7/2022 | Lin | ..................... | H03F 3/45197 |
| 11,437,963 B2 * | 9/2022 | Manganaro | ......... | H03F 3/45219 |
| 2022/0085778 A1 * | 3/2022 | Anmadwar | ......... | H03F 3/45695 |

* cited by examiner

*Primary Examiner* — Viet Q Nguyen
(74) *Attorney, Agent, or Firm* — Foley & Lardner LLP

(57) ABSTRACT

A device, a memory interface device, and a method of implementing an active inductor circuit are disclosed. In one aspect, the device includes one or more active inductor circuits, each including a first metal-oxide-semiconductor (MOS) transistor and a second MOS transistor. The first MOS transistor has a first terminal connected to a first voltage level, a second terminal connected to a resistor, and a gate terminal. The second MOS transistor has a first terminal connected to the first voltage level, a second terminal connected to a first current source and the gate terminal of the first MOS transistor, and a gate terminal connected to the resistor and to a capacitor connected to a second voltage level. One of the first MOS transistor and the second MOS transistor is a p-channel MOS (PMOS) transistor, and another of the first MOS transistor and the second MOS transistor is an n-channel MOS (NMOS) transistor.

20 Claims, 9 Drawing Sheets

CMOS ACTIVE INDUCTOR CIRCUIT FOR AMPLIFIER

TECHNICAL FIELD

The present disclosure generally relates to systems and methods for CMOS active inductor circuits for amplifiers, including but not limited to active inductor circuits that can be used in amplifiers for receivers in high speed memory interface devices.

BACKGROUND

Writing data into memory devices at very high speeds as well as reading data from memory devices at high speeds are becoming increasingly difficult. A memory controller of, for example, a processor typically sends multiple data, command, and address signals at very high speeds (e.g., 24 Gbps), and these signals have to be captured accurately and reliably by a receiver of the memory device. Similarly during memory read operations, high speed data transmitted from the memory need to be captured accurately and reliably by the receiver used inside the memory controller at a system-on-chip (SOC) end. The receiver has multiple components including an amplifier and a sampler. Current designs of such components may suffer from power supply induced jitter (PSIJ) and intersymbol interference (ISI), and may sacrifice key parameters such as power, performance, and area.

SUMMARY

The present embodiments relate to a device that can function as a load for an amplifier circuit. As the data rate for memory devices, e.g., graphics double data rate 6 (GDDR6) synchronous dynamic random access memory (SDRAM), interface goes higher towards 24 Gbps and beyond, one of the key challenges is optimizing power, performance, and area (PPA) of a SOC receiver (Rx) of the memory interface device. Different equalization schemes like continuous time linear equalization (CTLE) and decision feedback equalization (DFE) can be used to achieve the performance at 24 Gbps (e.g., in a GDDR6 SOC Rx) by improving the timing margin for the read path. Because data traffic in operation for a GDDR6 has random data and can arrive at any time without break for periodic training, continuous DFE adaptation (training) is not suitable as used in peripheral component interface express (PCIe) and other similar systems. For initial DFE training to converge to correct values, the receiver has to be able to detect majority of the data without DFE. Accordingly it would be beneficial to design a receiver that can detect the data signal correctly without the DFE.

According to some aspects, embodiments relate to a device. The device can include one or more active inductor circuits, each including a first metal-oxide-semiconductor (MOS) transistor and a second MOS transistor. Each first MOS transistor has a first terminal connected to a first voltage level, a second terminal connected to a resistor, and a gate terminal. The second MOS transistor has a first terminal connected to the first voltage level, a second terminal connected to a first current source and the gate terminal of the first MOS transistor, and a gate terminal connected to the resistor, and to a capacitor connected to a second voltage level. One of the first MOS transistor and the second MOS transistor is a p-channel MOS (PMOS) transistor, and another of the first MOS transistor and the second MOS transistor is an n-channel MOS (NMOS) transistor.

The device can further include an amplifier including a first active inductor circuit of the one or more active inductor circuits, a third MOS transistor, an input connected to a gate terminal of the third MOS transistor, and/or an output connected to the second terminal of the first MOS transistor of the first active inductor circuit, and to a first terminal of the third MOS transistor.

The device can further include a first differential amplifier including a first active inductor circuit of the one or more active inductor circuits and a second active inductor circuit of the one or more active inductive circuits. The first differential amplifier can further include a third MOS transistor having a first terminal connected to a first output of the first differential amplifier, and to the resistor of the first active inductor circuit. The third MOS transistor can have a second terminal connected to a second current source connected to the second voltage level. The third MOS transistor can have a gate (gate terminal) connected to a first input of the first differential amplifier. The device can further include a fourth MOS transistor having a first terminal connected to a second output of the first differential amplifier, and to the resistor of the second active inductor circuit. The fourth MOS transistor can have a second terminal connected to a third current source connected to the second voltage level and a gate connected to a second input of the first differential amplifier.

The first differential amplifier can further include a programmable CTLE connected to the second terminal of the third MOS transistor and the second terminal of the fourth MOS transistor. The device can further include a second differential amplifier. The second differential amplifier can include (1) a third active inductor circuit of the one or more active inductor circuits and/or (2) a fifth MOS transistor having a first terminal connected to a first output of the second differential amplifier, and to the resistor of the third active inductor circuit. The second differential amplifier can include a second terminal connected to a fourth current source connected to the second voltage level, and a gate connected to the first output of the first differential amplifier. The second differential amplifier can include (1) a fourth active inductor circuit of the one or more active inductor circuits and/or (2) a sixth MOS transistor having a first terminal connected to a second output of the second differential amplifier, and to the resistor of the fourth active inductor circuit, a second terminal connected to the fourth current source, and a gate connected to the second output of the first differential amplifier.

The device can further include a third differential amplifier including (1) a fifth active inductor circuit of the one or more active inductor circuits and (2) a seventh MOS transistor having a first terminal connected to a first output of the third differential amplifier, and to the resistor of the fifth active inductor circuit. The seventh MOS transistor can have a second terminal connected to a fifth current source connected to the second voltage level and a gate connected to the first output of the second differential amplifier. The third differential amplifier can include (1) a sixth active inductor circuit of the one or more active inductor circuits and (2) a eighth MOS transistor having a first terminal connected to a second output of the third differential amplifier, and to the resistor of the sixth active inductor circuit, a second terminal connected to the fifth current source, and a gate connected to the second output of the second differential amplifier.

The device can be included in a GDDR6 SDRAM device. The GDDR6 SDRAM device can include (1) a receiver comprising the first to third differential amplifiers and (2) one or more sampler circuits having first and second inputs.

The first and second outputs of the third differential amplifier can be respectively connected to the first and second inputs of the one or more sampler circuits.

The first voltage level can include a first power supply voltage (VDD), a second power supply voltage (VSS), ground or 0 volts. The second voltage level can include a first power supply voltage (VDD), a second power supply voltage (VSS), ground or 0 volts.

According to some aspects, embodiments relate to a memory interface device. The memory interface device can include a receiver configured to receive an input signal and including a first amplifier. The first amplifier can include (1) a first input transistor configured to receive the input signal and/or (2) a first active inductor circuit of one or more active inductor circuits. Each active inductor circuit can include a first transistor having a first terminal connected to a first voltage level, a second terminal connected to a first output, the input transistor, and a resistor, and a gate terminal. Each active inductor circuit can also include a second transistor having a first terminal connected to the first voltage level, a second terminal connected to a first current source and the gate terminal of the first transistor, and a gate terminal connected to the resistor, and to a capacitor connected to a second voltage level. The receiver can include (1) a second amplifier including a second active inductor circuit of the one or more active inductor circuits, wherein the second amplifier is connected to the first output of the first amplifier and (2) a third amplifier comprising a third active inductor circuit of the one or more active inductor circuits, wherein the third amplifier is connected to the first output of the second amplifier. The receiver can also include one or more samplers connected to the output of the third amplifier and configured to output an output signal.

The memory interface device can also include at least one double data rate (DDR) SDRAM device connected to the memory controller which uses this high speed receiver to read the data from the memory. The DDR SDRAM device can include at least one GDDR6 SDRAM device.

One of the first transistor and the second transistor can be a PMOS transistor, and another of the first transistor and the second transistor can be an NMOS transistor. The first amplifier can further include a second input transistor configured to receive the input signal, and/or a fourth active inductor circuit of the one or more active inductor circuits. The fourth active inductor circuit can be connected to the second input transistor and a second output connected to the second amplifier.

According to some aspects, embodiments relate to a method of implementing an active inductor circuit. The method can include connecting a first terminal of a first MOS transistor to a first voltage level, connecting a second terminal of the first MOS transistor to a resistor, connecting a first terminal of a second MOS transistor to the first voltage level, connecting a second terminal of the second MOS transistor to a first current source and a gate of the first MOS transistor, and connecting a gate of the second MOS transistor to the resistor, and to a capacitor connected to a second voltage level. One of the first MOS transistor and the second MOS transistor can be a PMOS transistor, and another of the first MOS transistor and the second MOS transistor can be an NMOS transistor.

The method can include connecting the resistor to a first terminal of a third MOS transistor and connecting a second terminal of the third MOS transistor to a second current source. The method can include connecting the second terminal of the third MOS transistor to a CTLE.

The active inductor circuit includes the first and second MOS transistors, the resistor, and the capacitor. The method can include connecting the active inductor circuit to one or more sampler circuits to receive a signal for a GDDR6 SDRAM device or receive a signal from a GDDR6 SDRAM. The method can be used in the other receiver circuits used for high speed interfaces.

BRIEF DESCRIPTION OF THE DRAWINGS

These and other aspects and features of the present embodiments will become apparent to those ordinarily skilled in the art upon review of the following description of specific embodiments in conjunction with the accompanying figures.

DETAILED DESCRIPTION

Figure 1:
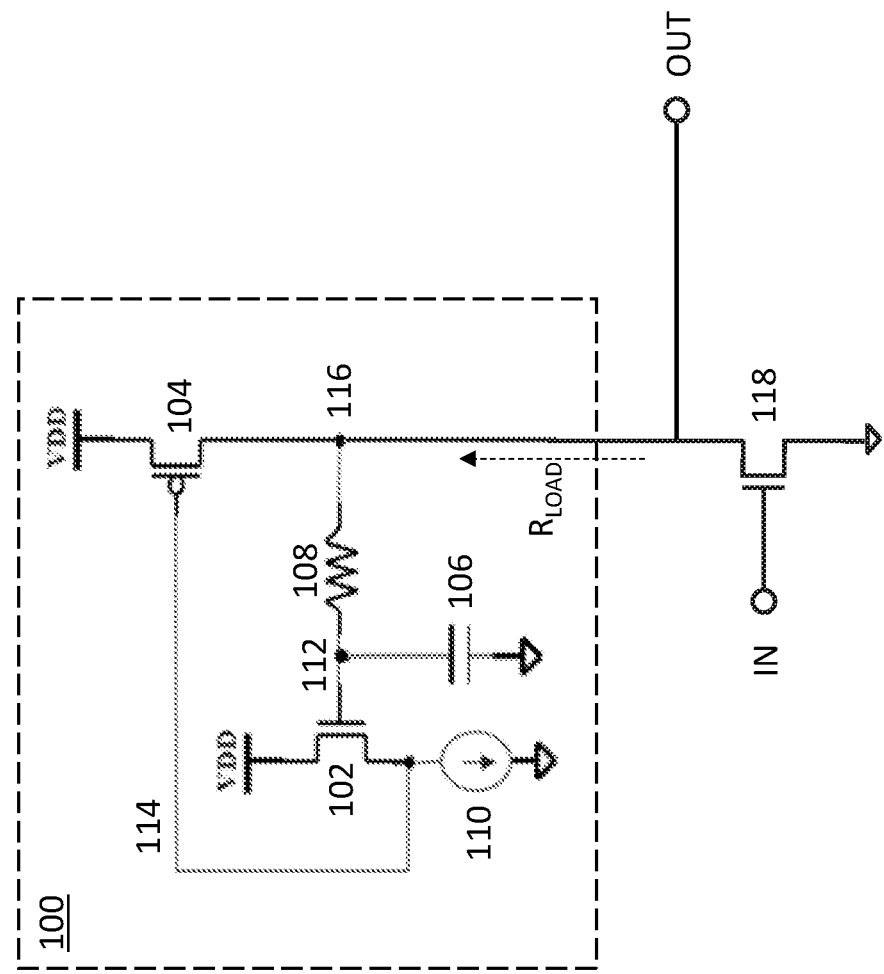
FIG. 1 illustrates a circuit diagram a single input amplifier including an active inductor circuit, according to some embodiments.

The present embodiments shall now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments shall be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

As the data rate for memory device interfaces go higher towards 24 Gbps and beyond, one of the key challenges is optimizing PPA of an SOC receiver of the memory interface device. Different equalization schemes like CTLE and DFE can be used to achieve the performance at 24 Gbps for a GDDR6 SOC Rx by improving the timing margin for the read path. For a GDDR6 interface, data traffic in operation has random data and can arrive at any time without break for periodic training, making it unsuitable for continuous DFE adaptation (training) as used in peripheral component interface express (PCIe) and other similar systems. DFE training is done during initialization of the interface. For initial DFE training to converge to correct values, the receiver has to be able to detect majority of the data without DFE. Accordingly it would be beneficial to design a receiver that can detect the data signal correctly without the DFE. Embodiments of the systems and methods disclosed herein can include a load for an amplifier within the receiver that is beneficial for 24 Gbps and greater speeds of GDDR6 memory interfaces.

It may be beneficial for a differential amplifier used in a GDDR6 SDRAM device operating at 24 Gbps or greater to have certain characteristics or parameters. First, the bandwidth should higher than the required data rate for which it is being used. For 24 Gbps applications, the bandwidth may be desired to be more than 12 GHz. The gain of the differential amplifier can be more than 1.5 for instance. And the PSIJ, power consumption, and/or area should all be small.

Typical loads in differential amplifiers are not able to satisfy one or more of these characteristics. For example, a typical load including one diode-connected transistor may not have enough input voltage margin to capture data accurately. As another example, having a resistor may involve the amplifier transistors to be large in size, increasing the load capacitance at the outputs which can lead to small bandwidths. While an active inductor circuit can be beneficial because it offers low impedance at low frequencies and high impedance at higher frequencies, typical active inductor circuits are also not suitable because they may involve too high of a voltage supply (increasing power consumption), or additional bias voltages are used which increase area and power as well increasing parasitic capacitance. Furthermore, typical active inductor circuits can add additional loading at the differential amplifier output which can cause the output poles of the differential amplifier to move to lower frequencies, limiting the bandwidth of the differential amplifiers.

The disclosed active inductor circuit(s) can be reliably implemented in differential amplifiers for the GDDR6 SDRAM interface receivers because the active inductor circuit(s) can increase the timing margin for the GDDR6 read path and detect majority of the data without DFE training. The output data of the differential amplifier designed by using disclosed active inductor circuit can have a good eye opening so that the sampler that receives the output of the differential amplifier can detect the data accurately. The disclosed active inductor circuit can have an effective load resistance that increases with higher frequency and therefore provide a good gain at around 12 GHz. The disclosed active inductor circuit can also have an effective load capacitance that decreases with higher frequency and therefore increase the bandwidth of the differential amplifier. Furthermore, the disclosed active inductor circuit can provide a Zero at an output node at higher frequencies which helps to increase the bandwidth.

FIG. 1 illustrates a circuit diagram of a single input amplifier 10 including an active inductor circuit 100, according to some embodiments. The single input amplifier 10 can include the active inductor circuit 100, transistor 118, input node IN and/or output node OUT. Although the single input amplifier 10 is shown to have certain number of components and connections, embodiments are not limited thereto, and the single input amplifier 10 can have more or fewer components therein. In this disclosure, examples of a transistor include, but are not limited to, metal oxide semiconductor field effect transistors (MOSFET), complementary metal oxide semiconductors (CMOS) transistors, PMOS, NMOS, high voltage transistors, high frequency transistors, P-channel and/or N-channel field effect transistors (PFETs/NFETs), FinFETs, planar MOS transistors with raised source/drains, nanosheet FETs, nanowire FETs, or the like. Furthermore, in this disclosure, although various references are made with respect to the individual components of the example active inductor circuits 100 and 602 of FIG. 1 and FIG. 6, respectively, similar descriptions can be applied to the active inductor circuits 302, 304, 402, 404, 702, 704, 802, and 804. For example, a reference to (or a description of) the current source 110 of the active inductor circuit 100 of FIG. 1 can also apply to one or both of the current sources 324 and 326 in the active inductor circuit 302 and 304 of FIG. 3.

The active inductor circuit 100 can include transistors 102 and 104, capacitor 106, resistor 108, and/or a current source 110. The transistor 102 can include an NMOS transistor having a first terminal (e.g., a source/drain (S/D) terminal or end), a second terminal, a gate terminal, and a body terminal (not shown in the drawing). The first terminal can be connected to a node 114, which can be connected to the current source 110. The second terminal can be connected to a first voltage level (or voltage source or power supply) VDD. The gate terminal can be connected to a node 112, which can be connected to the resistor 108 and the capacitor 106.

The transistor 104 can include a PMOS transistor having a first terminal, a second terminal, a gate terminal, and a body terminal (not shown in drawing). The first terminal can be connected to (e.g., coupled/linked to, and/or drive/load) a node 116, which can be connected to the transistor 118 and output node OUT. The second terminal can be connected to the voltage level VDD, and the gate terminal can be connected to the node 114.

The capacitor 106 can include a first terminal (e.g., plate/end/pin) and a second terminal. The first terminal can be connected to the node 112 (e.g., connected to elements connected to node 112), and the second terminal can be connected to a second voltage level VSS (or ground voltage or 0V).

The resistor 108 can include a first terminal and a second terminal. The first terminal can be connected to the gate terminal of the node 112, and the second terminal can be connected to the node 116 (e.g., connected to elements connected to node 116).

The transistor 118 can include a first terminal, a second terminal, a gate terminal and a body terminal (not shown in the drawing). The first terminal can be connected to the second voltage level VSS, the second terminal can be connected to the node 116 (and the output node OUT), and the gate terminal can be connected to the input node IN. Although the single input amplifier 10 includes the active inductor circuit 100 and the transistor 118, embodiments are not limited thereto, and the single input amplifier 10 can include more or fewer components including resistors, transistors, capacitors, inductors, etc.

Briefly, the active inductor circuit 100 can act as a load for an amplifier (single input or differential input) to increase a bandwidth of the amplifier. An effective load resistance of the active inductor circuit 100 can increase with increase in frequency and hence be able to provide a high gain at, e.g., about 12 GHz. An effective load capacitance of the active inductor circuit 100 can decrease with the increase in frequency and hence help increase the bandwidth of the single input amplifier 10 or a differential input amplifier.

For a differential input amplifier (e.g., FIGS. 2-4), the value of the effective load resistance $R_{LOAD}$ increases with the increase in frequency and hence the circuit behaves like an active inductive load. The effective impedance of active inductive load at low frequency is $1/g_m$ which is small, and thus the gain of the differential amplifier can be low at lower frequencies (e.g., about 100 Mhz to about 5 GHz). Also, the effective impedance at high frequencies is $r_o$ (output or internal resistance of, e.g., transistor 104 or 606) which is high, and can increase the gain of the differential amplifier at higher frequencies (e.g., 8 GHz to about 12 GHz). A resistor (e.g., resistor 108 or 610) is used for reducing the effective load cap at the output by isolating the gate capacitance of the transistor (e.g., transistor 102 or 604) at higher frequencies and hence increase the bandwidth of the differential amplifier. By using the appropriate value of the resistor (e.g., resistor 108 or 610) and/or capacitor (e.g., capacitor 106 or 608) the alternating current (AC) response of the differential amplifier can be flat till until around 12 GHz for example.

Figure 2:
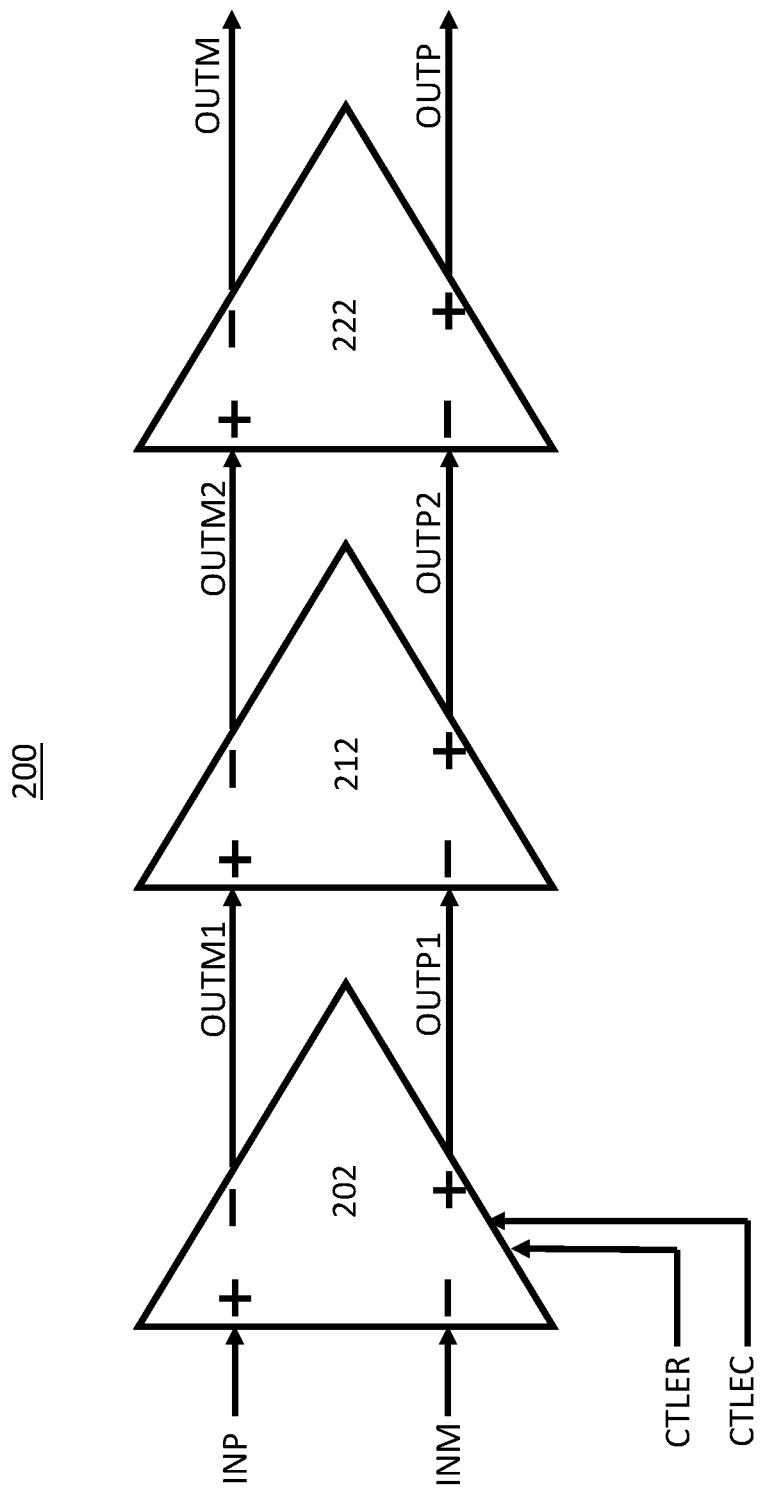
FIG. 2 illustrates a block diagram of another amplifier, according to some embodiments.

FIG. 2 illustrates a block diagram of an amplifier 200, according to some embodiments. The amplifier 200 can include a three-stage amplifier circuit. For example, the amplifier 200 can include a first stage amplifier 202, a second stage amplifier 212, and/or a third stage amplifier 222. Each of the first to third stage amplifiers 202, 212, and 222 can include a differential input amplifier, but embodiments are not limited thereto. For example, the first to third stage amplifiers 202, 212, and 222 can include a single input amplifier.

The first stage amplifier 202 can receive amplifier inputs INM and INP and control inputs CTLER and CTLEC. The first stage amplifier 202 can provide an output OUTM1 and an output OUTP1. The control inputs CTLER and the CTLEC can include control signals for a programmable CTLE circuit within the first stage amplifier 202 (see, e.g., FIG. 3).

The second stage amplifier 212 can receive the outputs OUTM1 and OUTP1 as inputs and can provide outputs OUTM2 and OUTP2. The second stage amplifier 212 can further amplify the data signal output by the first stage amplifier 202.

The third stage amplifier 222 can receive the outputs OUTM2 and OUTP2 as inputs and can provide outputs OUTM and OUTP. The third stage amplifier 222 can further amplify the data signal that is output by the second stage amplifier.

The amplifier input INP can be connected to an input data pad that receives memory data from, e.g., a memory device, a processor, field programmable gate array (FPGA), application specific integrated circuit (ASIC), a peripheral device, etc. The amplifier input INM can be connected to a reference voltage level VREF or the complimentary input data. Accordingly, each of the three stages can compare a voltage level (or data signal) of the memory data received at the amplifier input INP against the reference voltage level VREF received at the amplifier input INM and can amplify the voltage level (or data signal).

Figure 3:
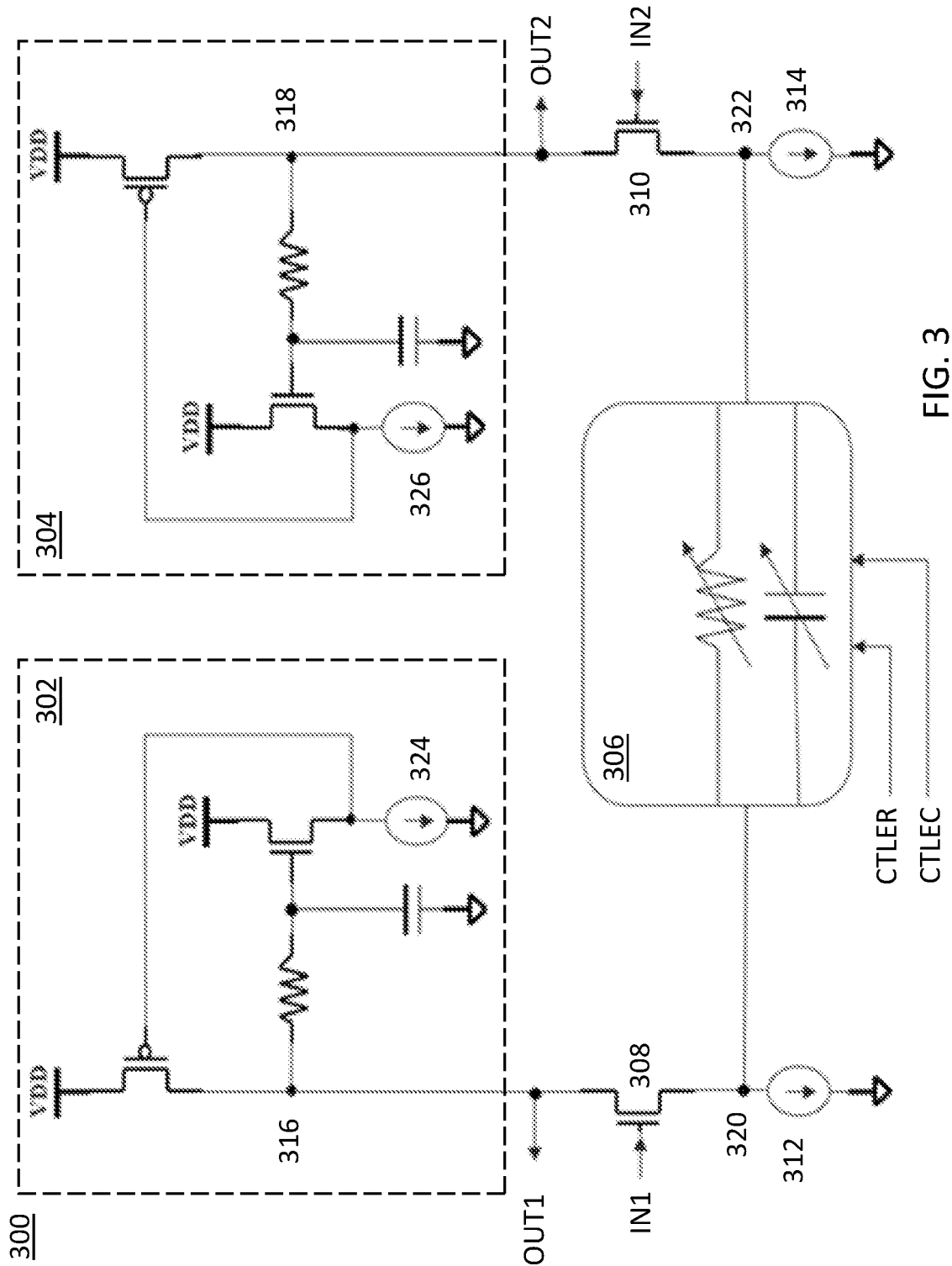
FIG. 3 illustrates a circuit diagram of yet another amplifier, according to some embodiments.

FIG. 3 illustrates a circuit diagram of an amplifier 300, according to some embodiments. The amplifier 300 can include active inductor circuits 302 and 304 (e.g., active inductor circuit 100), a programmable CTLE 306, transistors 308 and 310, and/or current sources 312 and 314. The first stage amplifier 202 can include the amplifier 300.

The transistor 308 can include a first terminal, a second terminal, a gate terminal, and a body terminal (not shown). The first terminal can be connected to a node 320, which is connected to the current source 312 and the CTLE 306. The second terminal can be connected to a node 316 (e.g., node 116), and the gate terminal can be connected to an input IN1. Similarly, the transistor 310 can include a first terminal, a second terminal, a gate terminal, and a body terminal (not shown). The first terminal can be connected to a node 322, which is connected to the current source 314 and the CTLE 306. The second terminal can be connected to the node 318 (e.g., node 116), and the gate terminal can be connected to the input IN2.

As discussed above, the programmable CTLE 306 can receive as inputs CTLER and CTLEC. The programmable CTLE 306 can compensate channel loss and provide equalized low-jitter output data. The inputs CTLER and CTLEC can be used to tune the programmable CTLE 306 to improve receiver performance such as bit error rate and jitter tolerance.

Referring to FIGS. 2 and 3, the first stage amplifier 202 can include the amplifier 300. The amplifier input INM can be connected to one of the inputs IN1 or IN2, and the amplifier input INP can be connected to the other one of the inputs IN1 or IN2. The amplifier 300 can amplify a voltage difference between a voltage level of the input IN1 and a voltage level of the input IN2 ($V_{IN1}-V_{IN2}$). and can output the difference of a voltage level at the output OUT1 and the output OUT2 ($V_{OUT1}-V_{OUT2}$). The output OUT1 can be connected to the output OUTM1 of amplifier 200 and the output OUT2 can be connected to the output OUTP1 of amplifier 200.

Figure 4:
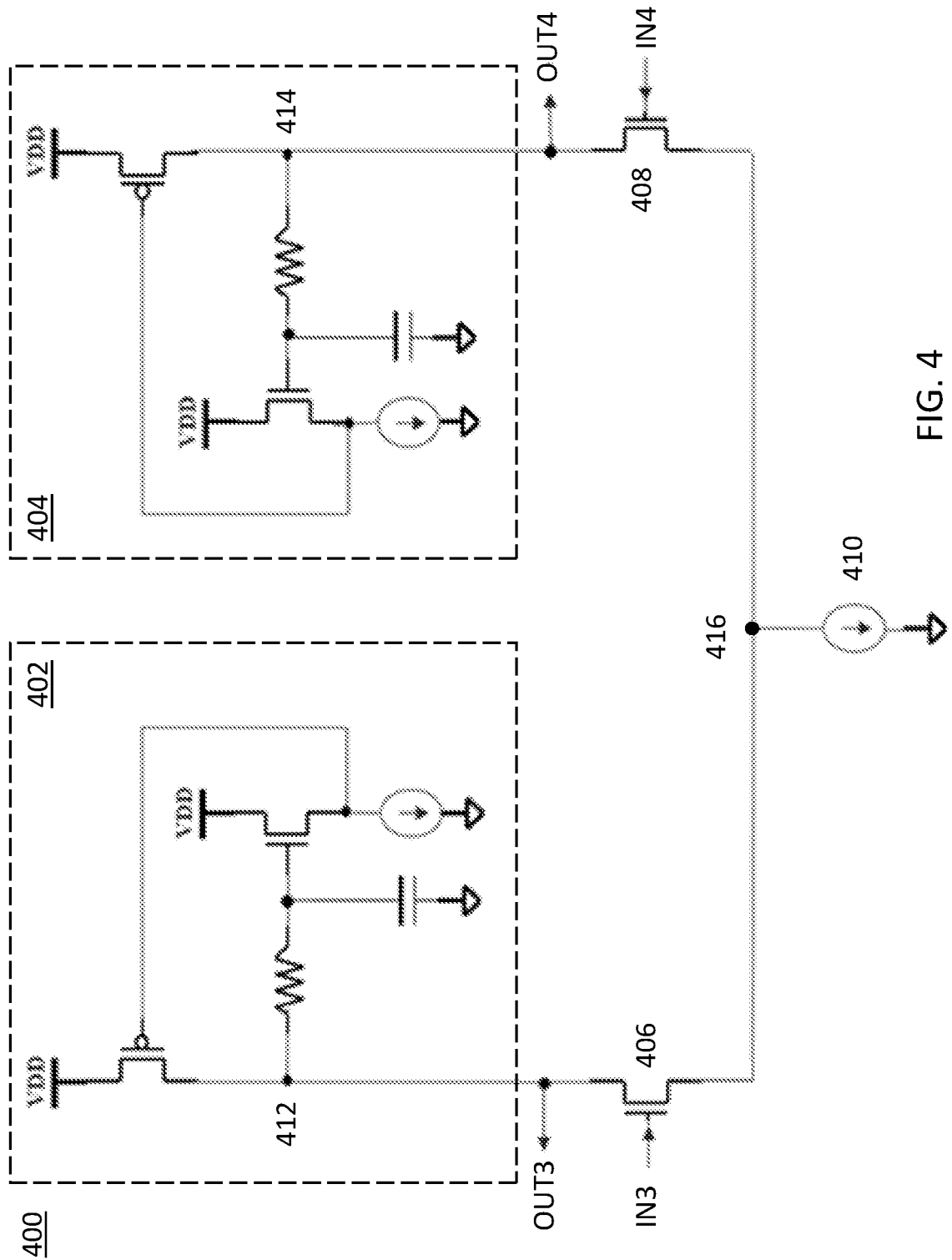
FIG. 4 illustrates a circuit diagram of still another amplifier, according to some embodiments.

FIG. 4 illustrates a circuit diagram of an amplifier 400, according to some embodiments. The amplifier 400 can include active inductor circuits 402 and 404 (e.g., active inductor circuit 100), transistors 406 and 408, and/or a current source 410. Each of the second and third stage amplifiers 212 and 222 can include the amplifier 400.

The transistor 406 can include a first terminal, a second terminal, a gate terminal, and a body terminal (not shown). The first terminal can be connected to a node 416, which is connected to the current source 410. The second terminal can be connected to a node 412 (e.g., node 116), and the gate terminal can be connected to an input IN3. Similarly, the transistor 408 can include a first terminal, a second terminal, a gate terminal, and a body terminal (not shown). The first terminal can be connected to the node 416, the second terminal can be connected to a node 414 (e.g., node 116), and the gate terminal can be connected to the input IN4.

Referring to FIGS. 2 and 4, the second stage amplifier 212 can include the amplifier 400. The output OUTM1 (output by the amplifier 300) can be connected to one of the inputs IN3 or IN4, and the output OUTP1 can be connected to the other one of the inputs IN3 or IN4. The second stage amplifier 212 can amplify a voltage difference between a voltage level of the input IN3 and a voltage level of the input IN4 ($V_{IN3}-V_{IN4}$) and can output the difference of a voltage level at the output OUT3 and the output OUT4 ($V_{OUT3}-V_{OUT4}$). The output OUT3 can be connected to the output OUTM2 of amplifier 200 and the output OUT4 can be connected to the output OUTP2 of amplifier 200.

The third stage amplifier 222 can include the amplifier 400. The output OUTM2 (output by the second stage amplifier 212) can be connected to one of the inputs IN3 or IN4, and the output OUTP2 can be connected to the other one of the inputs IN3 or IN4. The second stage amplifier 212 can amplify a voltage difference between a voltage level of the input IN3 and a voltage level of the input IN4 ($V_{IN3}-V_{IN4}$) and can output the difference of a voltage level at the output OUT3 and the output OUT4 ($V_{OUT3}-V_{OUT4}$). The output OUT3 can be connected to the output OUTM of amplifier 200, and the output OUT4 can be connected to the output OUTP of amplifier 200. Accordingly, a signal that is input to the amplifier 200 at the inputs INP and INM can be amplified and output by the outputs OUTM and OUTP.

A direct current (DC) bias current IBIAsi (e.g., current source 110 or 612) can be set and the transistor 102 or 604 can provide the DC biasing voltage for the gate of the transistor 104 or 606. The resistor 108 or 610 and the capacitor 106 or 608 can be used to adjust the frequency of the zero of the active inductor, the inductive behavior of which is used for the differential amplifier in the receiver of, for example, a GDDR6 SDRAM device. The resistor 108 or 610 can help isolate the gate capacitance of the transistor 102 or 604 at the output node at higher frequencies and can hence improve the bandwidth of the differential amplifier. The use of disclosed active inductor circuit can also help in reducing the variations of the differential amplifier gain across different process, voltage, temperature (PVT) corners.

For the first stage amplifier 202, either of the active inductor circuits 100 and 602 can be used as the load on both the outputs OUTP1 and OUTM1. The first stage amplifier 202 can therefore increase the bandwidth of the differential amplifier (e.g., differential amplifier 510) in the memory interface device. A DC bias current IBIAso (e.g., current source 312, 314 410, 712, 714, or 810) can used to provide DC biasing for the differential amplifier. An amplifier transistor (e.g., transistors 118, 308, 310 406, 408, 620, 708, 710, 806 and 808) can function as a common source amplifier for the received input data signal (e.g., inputs IN and IN1-IN4). The programmable CTLE (e.g., CTLE 306 or 706) can be used to equalize a degradation in the high speed data signal due to channel loss.

For the second and third stage amplifiers 212 and 222, the disclosed active inductive circuit acting as the load can increase the bandwidth of the second and third stage amplifiers 212 and 222. A CTLE circuit may not be used in the second and third stage amplifiers 212 and 222, since second and third stage amplifiers 212 and 222 do not directly interface with the channel where the data input PAD is received. Accordingly, the active inductor circuit as the load of for a multi-stage differential amplifier can provide a frequency dependent load for the differential amplifier.

Figure 5:
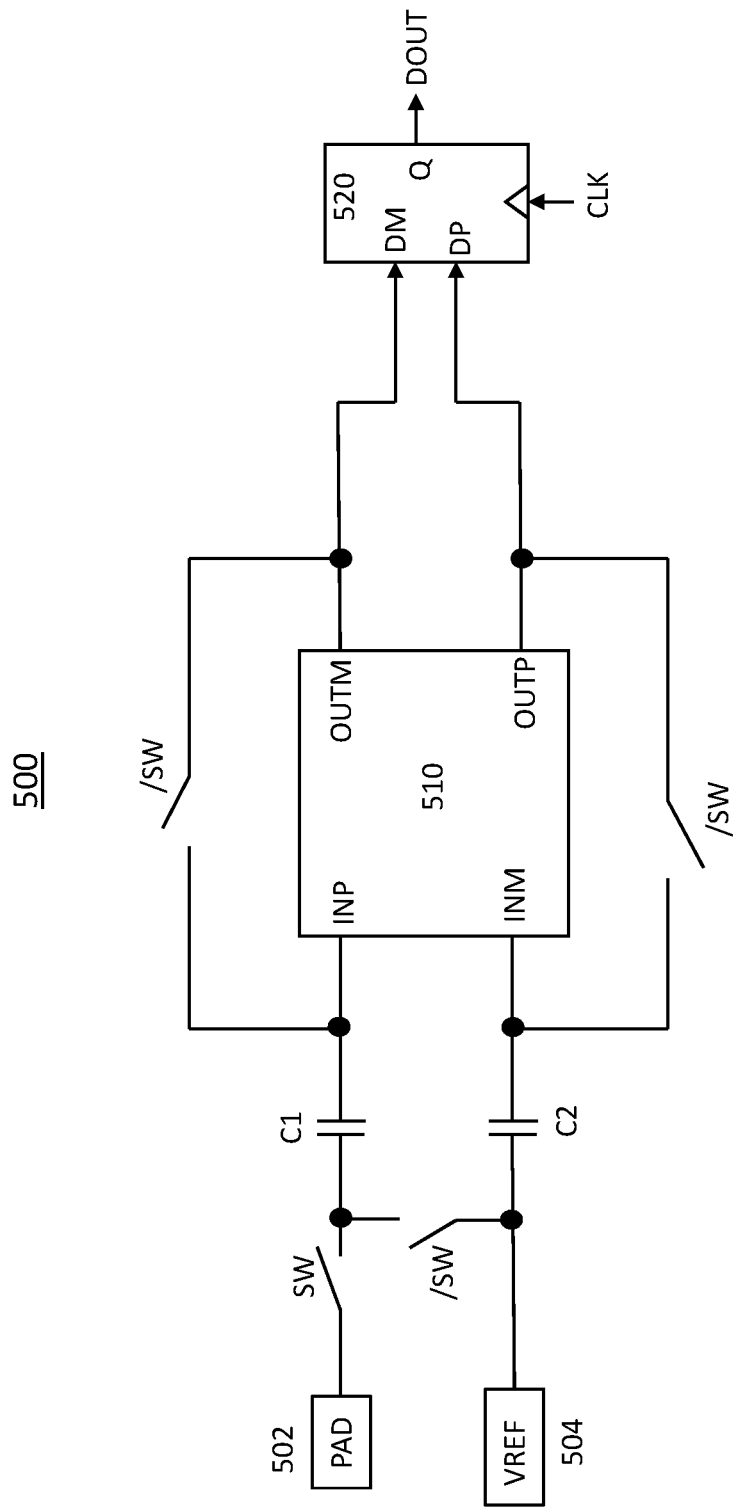
FIG. 5 illustrates an example receiver of a memory interface device, according to some embodiments.

FIG. 5 illustrates an example receiver 500 of a memory interface device, according to some embodiments. The receiver 500 can include a data input PAD, a reference voltage pad VREF, a plurality of switches SW and /SW, capacitors C1 and C2, an amplifier 510 (e.g., amplifier 200), and a sampler circuit 520. The receiver 500 can be part of a memory interface device such as a GDDR6 SDRAM device or the controller device which is interfacing with the GDDR6 SDRAM, but embodiments are not limited thereto, and the receiver 500 can be part of any memory interface device or non-memory interface device without departing from the scope of disclosure. Furthermore, although the receiver 500 includes certain components, embodiments are not limited thereto, and components may be added or removed and still be within the scope of disclosure. Although this disclosure refers to a data signal being received at the data input PAD, embodiments are not limited thereto. For example, an address signal or a control signal (e.g., command address, clock enable, reset, etc.) can be received by the receiver 500 at the data input PAD.

In the memory receiver, the data input PAD can receive (or be driven by) a data signal from a memory controller that is off-chip, such as a processor, FPGA, ASIC, etc. and in a memory controller receiver the data input PAD can receive (or be driven by) a data signal from a memory device like GDDR6 SDRAM. The reference voltage pad VREF can be connected/tied/set to a reference voltage level. The voltage level at the data input PAD (e.g., voltage level of a data signal) can be compared to the voltage level of the reference voltage pad VREF. For example, once the data signal is received at the data input PAD and the reference voltage VREF is applied, the both signals can be input to the amplifier 510 so that the difference between the two voltage levels (at the data input PAD and the reference voltage VREF) can be amplified. The amplified voltage difference can be output at the outputs OUTM and OUTP. The voltage level of the reference voltage VREF can be a $V_{REFL}$ (e.g., a voltage level lower than the common mode of the input signal at PAD) or a $V_{REFH}$ (e.g., a voltage level higher than the common mode of the input signal at PAD).

The sampler circuit (e.g., sample and hold circuit) 520 can sample/capture/measure the voltage difference at the inputs DM and DP by a clock signal CLK. For example, the sampler circuit 520 can receive the outputs OUTM and OUTP of the amplifier 510 at the inputs DM and DP, respectively. The sampler circuit 520 can provide either a high voltage level (e.g., logical "1") or a low voltage level (e.g., logical "0") as an output at output DOUT. For example, if the voltage level of the data signal at data input PAD is greater than the voltage level of the reference voltage VREF (or a predetermined voltage above the voltage level at the reference voltage pad VREF), the sampler circuit can output a high voltage at output Q (e.g., a logical "1"). As another example, if the voltage level of the data signal at the data input PAD is less than the voltage level of the reference voltage VREF (or a predetermined voltage below the voltage level at the reference voltage pad VREF), the sampler circuit 520 can output a low voltage at output Q (e.g., a logical "0"). Then, the output signal DOUT can provide the high or low voltage from the output Q to other control circuitry in a memory interface device (not shown) to write a logical "0" or a logical "1" in a memory cell of the memory device during memory write operation or in the memory controller during the memory read operation.

Accordingly, the active inductor circuit can be implemented in 24 Gbps GDDR6 SDRAM receivers or in memory controller receiver to increase the bandwidth of the receiver. The active inductor circuit in the differential amplifier can increase the low timing margin found on the read path of the GDDR6 SDRAM. Furthermore, using a 3-stage differential amplifier with the disclosed active inductor circuit, lower power and area can be consumed compared to conventional receiver architecture.

Figure 6:
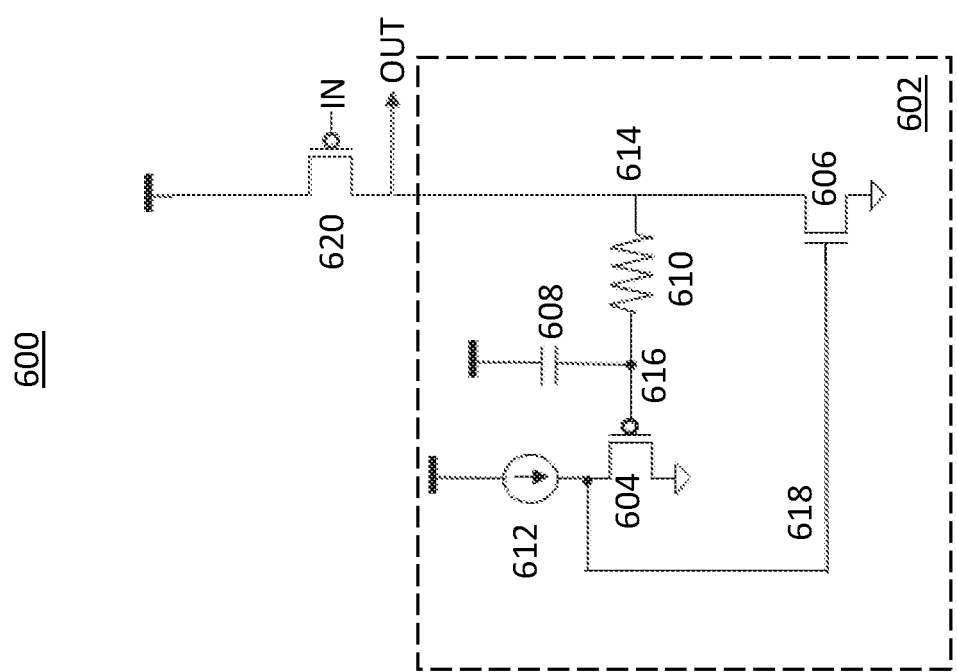
FIG. 6 illustrates a single input amplifier including an active inductor circuit, according some embodiments.

FIG. 6 illustrates a single input amplifier 600 including an active inductor circuit 602, according to some embodiments. The single input amplifier 600 can include the active inductor circuit 602, and/or a transistor 620. The single input amplifier 600 can be similar to the amplifier 10 of FIG. 1, except that single input amplifier 600 includes a PMOS transistor that receives an input at the input node IN with an NMOS load including the active inductor circuit 602, whereas the single input amplifier 10 includes an NMOS transistor that receives an input at the input node IN with a PMOS load including the active inductor circuit 100.

The transistor 604 can include a PMOS transistor including a first terminal, a second terminal, a gate terminal, and a body terminal (not shown). The first terminal can be connected to the second voltage level VSS. The second terminal can be connected to a node 618, which is connected to a current source 612 and the gate terminal of transistor 606. The gate terminal can be connected to a node 616, which can be connected to a resistor 610 and a capacitor 608.

The transistor 606 can include an NMOS transistor including a first terminal, a second terminal, a gate terminal, and a body terminal (not shown). The first terminal can be connected to the second voltage level VSS. The second terminal can be connected to a node 614, which can be connected to the resistor 610, an output node OUT, and/or the transistor 620.

The capacitor 608 can include a first terminal and a second terminal. The first terminal can be connected to the first power level VDD, and the second terminal can be connected to the node 616. The resistor 610 can include a first terminal connected to the node 616 and a second terminal connected to the node 614.

The transistor 620 can include a PMOS transistor including a first terminal, a second terminal, a gate terminal, and a body terminal (not shown). The first terminal can be connected to the node 614, the second terminal can be connected to the first voltage level VDD, and the gate terminal can be connected to an input node IN.

Figure 7:
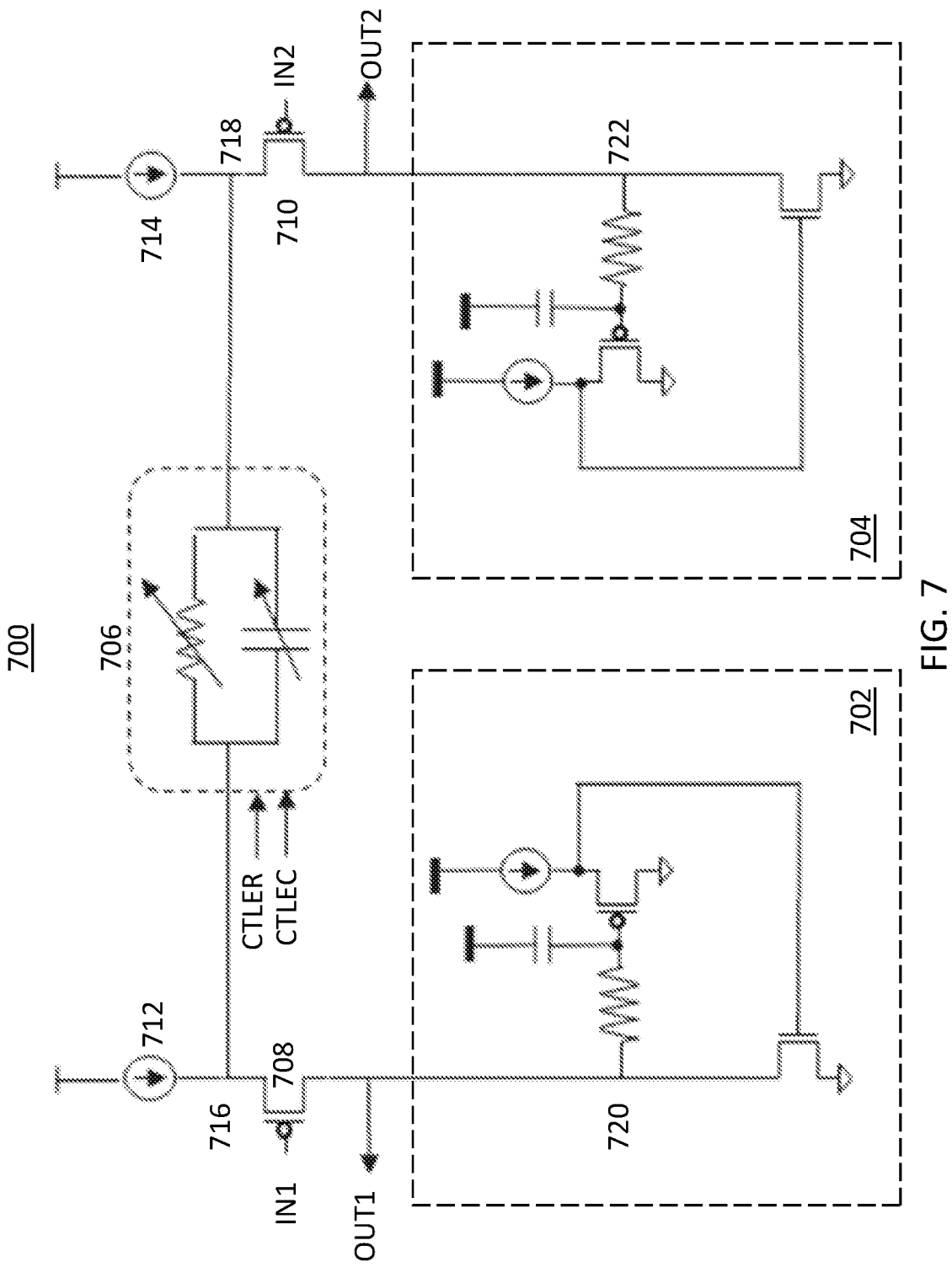
FIG. 7 illustrates a circuit diagram of another amplifier, according to some embodiments.

FIG. 7 illustrates a circuit diagram of an amplifier 700, according to some embodiments. The amplifier 700 can include active inductor circuits 702 and 704 (e.g., active inductor circuit 602), a programmable CTLE 706, transistors 708 and 710, and/or current sources 712 and 714. The first stage amplifier 202 can include the amplifier 700.

The transistor 708 can include a PMOS transistor including a first terminal, a second terminal, a gate terminal, and a body terminal (not shown). The first terminal can be connected to output OUT1 and a node 720 (e.g., node 614) of the active inductor circuit 702. The second terminal can be connected to a node 716, which is connected to the current source 712 and the CTLE 706. The gate terminal can be connected to an input IN1. Similarly, the transistor 710 can include a PMOS transistor including a first terminal, a second terminal, a gate terminal, and a body terminal (not shown). The first terminal can be connected to an output OUT2 and a node 722 (e.g., node 614) of the active inductor circuit 704. The second terminal can be connected to the node 718, which is connected to the current source 714 and the CTLE 706. The gate terminal can be connected to the input IN2.

As discussed above, the programmable CTLE 706 can receive as inputs CTLER and CTLEC. The programmable CTLE 706 can compensate channel loss and can provide equalized low-jitter output data. The inputs CTLER and CTLEC can be used to tune the programmable CTLE 706 to improve receiver performance such as bit error rate and jitter tolerance.

Referring to FIGS. 2 and 7, the first stage amplifier 202 can include the amplifier 700. The amplifier input INM can be connected to one of the inputs IN1 or IN2, and the amplifier input INP can be connected to the other one of the inputs IN1 or IN2. The amplifier 700 can amplify a voltage difference between a voltage level of the input IN1 and a voltage level of the input IN2 ($V_{IN1}-V_{IN2}$) and can output the difference of a voltage level at the output OUT1 and the output OUT2 ($V_{OUT1}-V_{OUT2}$). The output OUT1 can be connected to the output OUTM1 of amplifier 200 and the output OUT2 can be connected to the output OUTP1 of amplifier 200.

Figure 8:
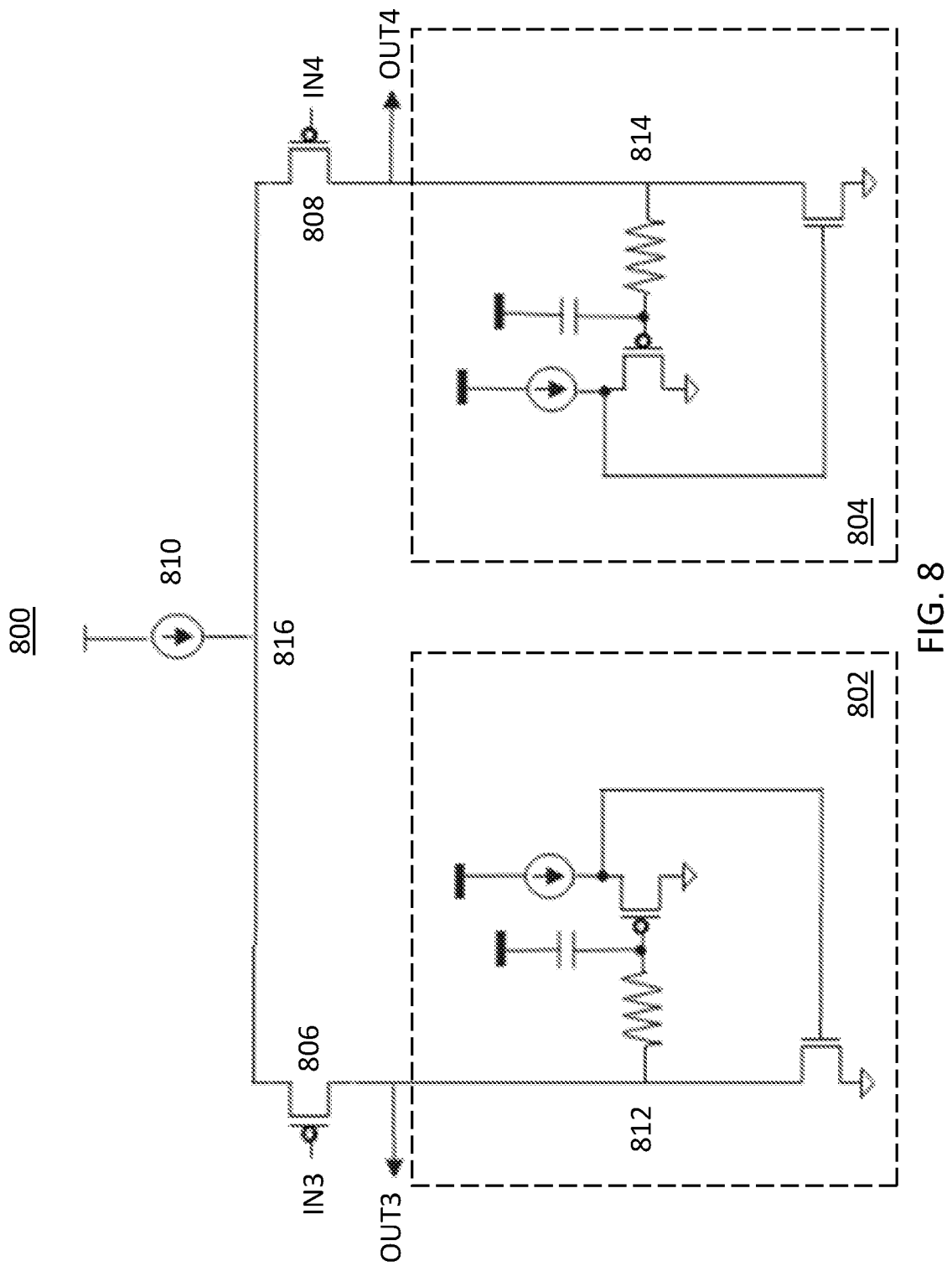
FIG. 8 illustrates a circuit diagram of yet another amplifier, according to some embodiments.

FIG. 8 illustrates a circuit diagram of an amplifier 800, according to some embodiments. The amplifier 800 can include active inductor circuits 802 and 804 (e.g., active inductor circuit 602), transistors 806 and 808, and/or a current source 810. Each of the second and third stage amplifiers 212 and 222 can include the amplifier 800.

The transistor 806 can include PMOS transistor having a first terminal, a second terminal, a gate terminal, and a body terminal (not shown). The first terminal can be connected to an output OUT3 and a node 812 of the active inductor circuit 802. The second terminal can be connected to a node 816, which is connected to the current source 810. The gate terminal can be connected to an input IN3. Similarly, the transistor 808 can include a PMOS transistor having a first terminal, a second terminal, a gate terminal, and a body terminal (not shown). The first terminal can be connected to an output OUT4 and a node 814 (e.g., node 614) of the active inductor circuit 804. The second terminal can be connected to the node 816, and the gate terminal can be connected to the input IN4.

Referring to FIGS. 2 and 8, the second stage amplifier 212 can include the amplifier 800. The output OUTM1 (output by the amplifier 700) can be connected to one of the inputs IN3 or IN4, and the output OUTP1 can be connected to the other one of the inputs IN3 or IN4. The second stage amplifier 212 can amplify a voltage difference between a voltage level of the input IN3 and a voltage level of the input IN4 ($V_{IN3}-V_{IN4}$) and can output the difference of a voltage level at the output OUT3 and the output OUT4 ($V_{OUT3}-V_{OUT4}$). The output OUT3 can be connected to the output OUTM2 of amplifier 200 and the output OUT4 can be connected to the output OUTP2 of amplifier 200.

The third stage amplifier 222 can include the amplifier 800. The output OUTM2 (output by the second stage amplifier 212) can be connected to one of the inputs IN3 or IN4, and the output OUTP2 can be connected to the other one of the inputs IN3 or IN4. The second stage amplifier 212 can amplify a voltage difference between a voltage level of the input IN3 and a voltage level of the input IN4 ($V_{IN3}-V_{IN4}$) and can output the difference of a voltage level at the output OUT3 and the output OUT4 ($V_{OUT3}-V_{OUT4}$). The output OUT3 can be connected to the output OUTM of amplifier 200, and the output OUT4 can be connected to the output OUTP of amplifier 200. Accordingly, a signal that is input to the amplifier 200 at the inputs INP and INM can be amplified and output by the outputs OUTM and OUTP.

Figure 9:
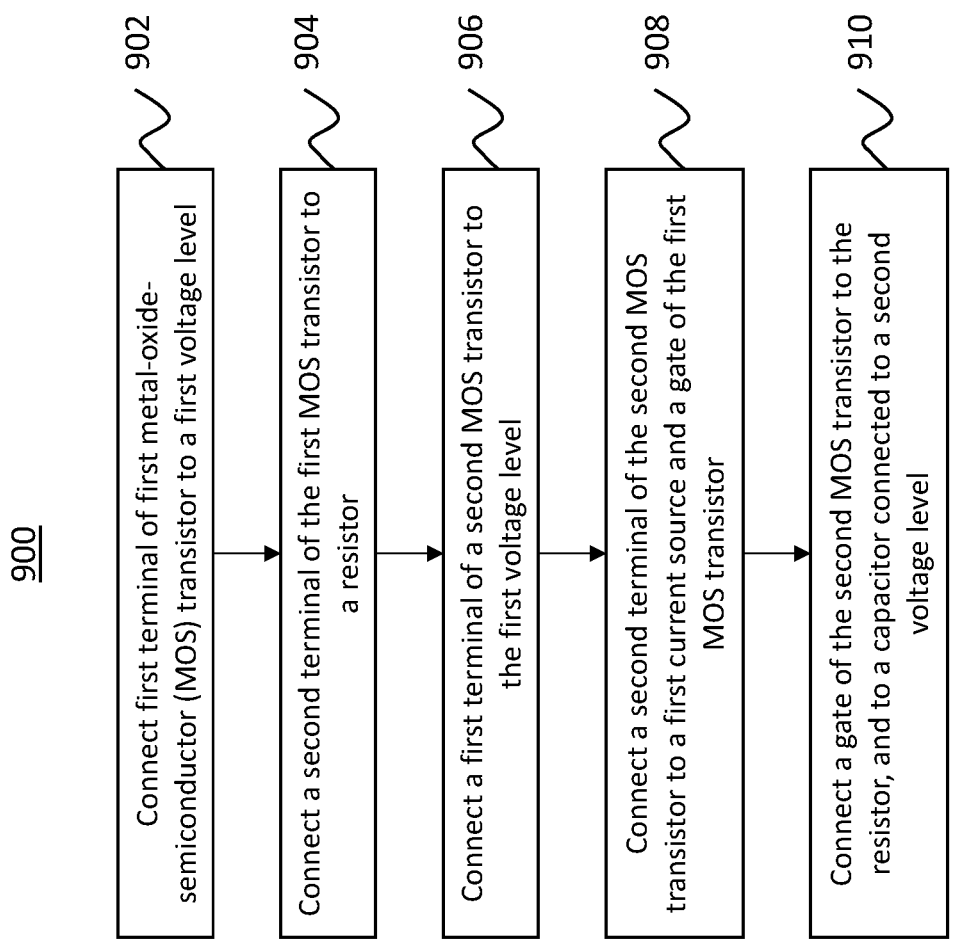
FIG. 9 is a flow chart illustrating an example method of implementing an active inductor circuit, according to some embodiments.

FIG. 9 is a flow chart illustrating an example method 900 of implementing an active inductor circuit, according to some embodiments. The method 900 can include an operation 902 of connecting a first terminal of a first MOS transistor (e.g., transistor 104 or 606) to a first voltage level (e.g., one of the first voltage level VDD or second voltage level VSS). The method 900 can include an operation 904 of connecting a second terminal of the first MOS transistor to a resistor (e.g., resistor 108 or 610). The method 900 can include an operation 906 of connecting a first terminal of a second MOS transistor (e.g., transistor 102 or 604) to the first voltage level. The method 900 can include an operation 908 of connecting a second terminal of the second MOS transistor to a first current source and a gate of the first MOS transistor. The method 900 can include an operation 910 of connecting a gate of the second MOS transistor to the resistor and to a capacitor (e.g., capacitor 106 or 608) connected to a second voltage level (e.g., the other of the first voltage level VDD or second voltage level VSS). In method 900, one of the first MOS transistor and the second MOS transistor is a PMOS transistor, and another of the first MOS transistor and the second MOS transistor is an NMOS transistor.

The method 900 can include connecting the resistor to a first terminal of a third MOS transistor (e.g., transistor 118, 308, 310, 406, 408, 620, 708, 710, 806, or 808) and connecting the second terminal of the third MOS transistor to a current source and a CTLE (e.g., CTLE 306 or 706). The method 900 can also include connecting the second terminal of the first MOS transistor to one or more sampler circuits (e.g., sampler circuit 520) to receive a signal for a GDDR6 SDRAM device interface.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A device comprising:
   one or more active inductor circuits, each comprising:
      a first metal-oxide-semiconductor (MOS) transistor having:
         a first terminal connected to a first voltage level;
         a second terminal connected to a resistor, and
         a gate terminal; and
      a second MOS transistor having:
         a first terminal connected to the first voltage level,
         a second terminal connected to a first current source and the gate terminal of the first MOS transistor, and
         a gate terminal connected to the resistor, and to a capacitor connected to a second voltage level,
      wherein one of the first MOS transistor and the second MOS transistor is a p-channel MOS (PMOS) transistor, and another of the first MOS transistor and the second MOS transistor is a n-channel MOS (NMOS) transistor.

2. The device of claim 1, further comprising:
   an amplifier comprising:
      a first active inductor circuit of the one or more active inductor circuits,
      a third MOS transistor,
      an input connected to a gate terminal of the third MOS transistor, and
      an output connected to the second terminal of the first MOS transistor of the first active inductor circuit, and to a first terminal of the third MOS transistor.

3. The device of claim 1, further comprising:
   a first differential amplifier comprising:
      a first active inductor circuit of the one or more active inductor circuits; and
      a second active inductor circuit of the one or more active inductive circuits.

4. The device of claim 3, wherein the first differential amplifier further comprises:
   a third MOS transistor having:
      a first terminal connected to a first output of the first differential amplifier, and to the resistor of the first active inductor circuit;
      a second terminal connected to a second current source connected to the second voltage level; and
      a gate terminal connected to a first input of the first differential amplifier; and
   a fourth MOS transistor having:
      a first terminal connected to a second output of the first differential amplifier, and to the resistor of the second active inductor circuit;
      a second terminal connected to a third current source connected to the second voltage level; and
      a gate terminal connected to a second input of the first differential amplifier.

5. The device of claim 4, wherein the first differential amplifier further comprises:
   a programmable continuous time linear equalizer (CTLE) connected to the second terminal of the third MOS transistor and the second terminal of the fourth MOS transistor.

6. The device of claim 5, further comprising a second differential amplifier, the second differential amplifier comprising:
   a third active inductor circuit of the one or more active inductor circuits;
   a fifth MOS transistor having:
      a first terminal connected to a first output of the second differential amplifier, and to the resistor of the third active inductor circuit;
      a second terminal connected to a fourth current source connected to the second voltage level; and
      a gate terminal connected to the first output of the first differential amplifier;
   a fourth active inductor circuit of the one or more active inductor circuits; and
   a sixth MOS transistor having:
      a first terminal connected to a second output of the second differential amplifier, and to the resistor of the fourth active inductor circuit;
      a second terminal connected to the fourth current source; and
      a gate terminal connected to the second output of the first differential amplifier.

7. The device of claim 6, further comprising a third differential amplifier, the third differential amplifier comprising:
   a fifth active inductor circuit of the one or more active inductor circuits;
   a seventh MOS transistor having:
      a first terminal connected to a first output of the third differential amplifier, and to the resistor of the fifth active inductor circuit;
      a second terminal connected to a fifth current source connected to the second voltage level; and
      a gate terminal connected to the first output of the second differential amplifier;
   a sixth active inductor circuit of the one or more active inductor circuits; and
   a eighth MOS transistor having:
      a first terminal connected to a second output of the third differential amplifier, and to the resistor of the sixth active inductor circuit;
      a second terminal connected to the fifth current source; and
      a gate terminal connected to the second output of the second differential amplifier.

8. The device of claim 7, wherein the device is included in a graphics double data rate 6 (GDDR6) synchronous dynamic random access memory (SDRAM) device.

9. The device of claim 8, wherein the GDDR6 SDRAM device comprises:
a receiver comprising the first to third differential amplifiers; and
one or more sampler circuits having first and second inputs,
wherein the first and second outputs of the third differential amplifier are respectively connected to the first and second inputs of the one or more sampler circuits.

10. The device of claim 1, wherein the first voltage level comprises a first power supply voltage (VDD), a second power supply voltage (VSS), ground or 0 volts.

11. The device of claim 1, wherein the second voltage level comprises a first power supply voltage (VDD), a second power supply voltage (VSS), ground or 0 volts.

12. A memory interface device, comprising:
a receiver configured to receive an input signal and comprising:
a first amplifier comprising:
a first input transistor configured to receive the input signal; and
a first active inductor circuit of one or more active inductor circuits, each active inductor circuit comprising:
a first transistor having:
a first terminal connected to a first voltage level;
a second terminal connected to a first output, the input transistor, and a resistor, and
a gate terminal; and
a second transistor having:
a first terminal connected to the first voltage level,
a second terminal connected to a first current source and the gate terminal of the first transistor, and
a gate terminal connected to the resistor, and to a capacitor connected to a second voltage level;
a second amplifier comprising a second active inductor circuit of the one or more active inductor circuits, wherein the second amplifier is connected to the first output of the first amplifier;
a third amplifier comprising a third active inductor circuit of the one or more active inductor circuits, wherein the third amplifier is connected to the first output of the second amplifier; and
one or more samplers connected to the output of the third amplifier and configured to output an output signal.

13. The memory interface device of claim 12, further comprising:
at least one double data rate (DDR) synchronous dynamic random access memory (SDRAM) device connected to the one or more samplers to receive the output signal.

14. The memory interface device of claim 13, wherein the at least one DDR SDRAM device includes at least one graphics double data rate 6 (GDDR6) SDRAM device.

15. The memory interface device of claim 12, wherein one of the first transistor and the second transistor is a p-channel metal-oxide-semiconductor (PMOS) transistor, and another of the first transistor and the second transistor is an n-channel metal-oxide-semiconductor (NMOS) transistor.

16. The memory interface device of claim 12, wherein the first amplifier further comprises:
a second input transistor configured to receive the input signal;
a fourth active inductor circuit of the one or more active inductor circuits, wherein the fourth active inductor circuit is connected to the second input transistor and a second output connected to the second amplifier.

17. A method of implementing an active inductor circuit, comprising:
connecting a first terminal of a first metal-oxide-semiconductor (MOS) transistor to a first voltage level;
connecting a second terminal of the first MOS transistor to a resistor;
connecting a first terminal of a second MOS transistor to the first voltage level;
connecting a second terminal of the second MOS transistor to a first current source and a gate terminal of the first MOS transistor;
connecting a gate terminal of the second MOS transistor to the resistor, and to a capacitor connected to a second voltage level,
wherein one of the first MOS transistor and the second MOS transistor is a p-channel MOS (PMOS) transistor, and another of the first MOS transistor and the second MOS transistor is a n-channel MOS (NMOS) transistor.

18. The method of claim 17, further comprising:
connecting the resistor to a first terminal of a third MOS transistor; and
connecting a second terminal of the third MOS transistor to a second current source.

19. The method of claim 18, further comprising:
connecting the second terminal of the third MOS transistor to a continuous time linear equalizer (CTLE).

20. The method of claim 17, wherein the active inductor circuit includes the first and second MOS transistors, the resistor, and the capacitor, and wherein the method further comprises:
connecting the active inductor circuit to one or more sampler circuits to receive a signal for a graphics double data rate 6 (GDDR6) synchronous dynamic random access memory (SDRAM) device.

* * * * *